United States Patent [19]

Kawana

[11] Patent Number: 4,942,318

[45] Date of Patent: Jul. 17, 1990

[54] FOR CONDITIONING THE INPUT TO OR THE OUTPUT FROM AN INTEGRATED CIRCUIT

[75] Inventor: Keiichi Kawana, Chiba, Japan

[73] Assignee: Kawasaki Steel Corporation, Hyogo, Japan

[21] Appl. No.: 251,467

[22] Filed: Sep. 30, 1988

[30] Foreign Application Priority Data

Oct. 2, 1987 [JP] Japan .................. 62-249185

[51] Int. Cl.[5] ......................................... H03K 19/177
[52] U.S. Cl. .................................. 307/465; 307/243; 307/468; 307/475
[58] Field of Search ............................. 307/465-469, 307/475, 243, 481, 272.2; 364/716

[56] References Cited

U.S. PATENT DOCUMENTS

| | | | |
|---|---|---|---|
| 4,684,830 | 8/1987 | Tsui et al. | 307/465 |
| 4,742,252 | 5/1988 | Agrawal | 307/465 |
| 4,758,746 | 7/1988 | Birkner et al. | 307/468 X |
| 4,758,747 | 7/1988 | Young et al. | 307/465 |
| 4,763,020 | 8/1988 | Takata et al. | 307/469 X |
| 4,771,285 | 9/1988 | Agrawal et al. | 307/465 X |
| 4,775,840 | 10/1988 | Ohmori et al. | 328/111 |

FOREIGN PATENT DOCUMENTS

| | | |
|---|---|---|
| 0177280 | 4/1986 | European Pat. Off. |
| 0196771 | 10/1986 | European Pat. Off. |
| 61-216520 | 9/1986 | Japan |
| 62-58722 | 3/1987 | Japan |
| 62-151053 | 7/1987 | Japan |

OTHER PUBLICATIONS

Hsieh et al., "A 9000-Gate-User-Programmable Gate Array," IEEE 1988 Custom Integrated Circuits Conference, pp. 15.3.1–15.3.7, (May 16–19, 1988).

El Gamal et al., "An Architecture for Electrically Configurable Gate Arrays," IEEE 1988 Custom Integrated Circuits Conference pp. 15.4.1–15.4.4, (May 16–19, 1988).

Electro/86 and Mini/Micro Northeast Conference Record, May 13–15, 1986, vol. 11, pp. 26/3,1/26/3,11, Los Angeles, Calif., R. J. Jigour.

Electronic Design, vol. 35, Sep. 17, 1987, pp. 83–86, Hasbrouck Heights, N.J., D. Bursky, "Enhanced Programmable Arrays Challenge . . .".

Primary Examiner—David Hudspeth
Attorney, Agent, or Firm—Oliff & Berridge

[57] ABSTRACT

In a programmable input/output circuit connected to an input terminal or an output terminal of an integrated circuit, a desirable combination from signals including a signal of the input terminal, an input or output signal of a storage element, an input or output signal of a combinational logic circuit, an input or output signal of another selector and the like is selected by use of at least one programmable selector, processed and output into the output terminal, so that an input or output circuit for performing a desirable signal process can be provided. Further, at least one dynamic selector circuit is provided, so that an output signal from another input/output circuit can be input into the storage element and an output signal from the storage element can be supplied to another input/output circuit.

15 Claims, 7 Drawing Sheets

FOR CONDITIONING THE INPUT TO OR THE OUTPUT FROM AN INTEGRATED CIRCUIT

BACKGROUND OF THE INVENTION (a) Field of the Invention

The present invention relates to a programmable input/output circuit connected to an input terminal or an output terminal of an integrated circuit (hereinafter referred briefly to as an "IC") such as a programmable logic device (hereinafter referred briefly to as an "PLD") and capable of programmably performing logical process input signals or output signals.

(b) Description of the Prior Art

As an IC with which a user realizes a logical function associated with an application to a highly integrated degree within reach, there has been used a PLD or the like.

The PLD includes a plurality of programmable logic elements, and further, in the PLD, outputs and inputs of the respective logic elements can be desirably connected to each other by programmable wirings.

In general, an input signal to this PLD from the outside is directly input into specified input terminals of programmable circuit portions (such as an AND plane) of the logic elements.

As an example of arrangement of the logic elements used in conventional PLD, there is one proposed in Japanese Patent Application Unexamined Publication No. 58722/1987. As shown in a block diagram in FIG. 12, this logic element is of such an arrangement that functional cells 102 for realizing a counter, a shift register and the like are placed after logic outputs of the programmable circuit portions (an AND plane 100 and OR planes 101). The input signal from the outside should be input into input terminals 103 of the AND plane 100 in this example as well.

However, the PLD in the above-described technique presents the following problems. (1) When the input process such as removal of a noise component included in the input signal is conducted, the AND plane 100 and the like should necessarily be used, whereby the efficiency of use of the logic element is lowered to a considerable extent. (2) The same use of the AND plane 100 and the like as described above makes the area of the circuit be increased and the working speed of the circuit be slow.

SUMMARY OF THE INVENTION

The present invention has been developed to obviate the above-described problems and has as its first object the provision of a programmable input/output circuit connected to an input terminal or an output terminal of an IC, wherein processing of input signals or output signals can be performed programmably, and, when this input/output circuit is used in a PLD, the efficiency of use of a programmable logic element can be improved.

Furthermore, a second object of the present invention is to provide a programmable input/output circuit connectable to other input/output circuits, whereby expansion is made easy.

To achieve the above-described first object, the present invention contemplates an input/output circuit connected to an input terminal or an output terminal of an IC, wherein the input/output circuit includes at least one input terminal, at least one storage element, at least one combinational logic circuit, at least one output terminal and at least one programmable selector, and two or more signals from signals including at least a signal from the input terminal, an output signal from the storage element and an output signal from the combinational logic circuit are connected to an input terminal of the selector and an output selected by the selector is connected to any one of the input/output terminals including at least an input terminal of the storage element, an input terminal of the combinational logic circuit and the aforesaid output terminal.

To achieve the above-described second object, the present invention contemplates an input/output circuit connected to an input terminal or an output terminal of an IC, wherein the input/output circuit includes at least one input terminal, at least one storage element, at least one output terminal, at least one programmable selector and at least one dynamic selector circuit, and the dynamic selector circuit supplies a signal selected from signals including at least an output signal from another input/output circuit and a signal from the aforesaid input terminal to an input terminal of the storage element and an output signal from the storage element can be supplied to another input/output circuit as well.

According to the present invention, in a programmable input/output circuit connected to an input terminal or an output terminal of an IC, a desirable combination from signals including a signal of the input terminal, an input or output signal of the storage element, an input or output signal of the combinational logic circuit, an input or output signal of another selector (if present) and the like is selected by use of at least one programmable selector, processed and output into the aforesaid output terminal, whereby an input circuit or an output circuit for performing a desirable signal process can be provided.

In consequence, direct connection to the input or output terminal of the IC can be made, so that processing of the input signal applied to the input terminal or of the output signal from the output terminal can be directly performed by the shortest wiring. Further, the programmable selector and the storage element for holding the input signals and the like make it possible to form the input/output circuit efficiently, thus decreasing the circuit in terms of the area thereof. Furthermore, the arrangement, in which the input or output signal is directly processed, the wiring is made shortest and the area is decreased, makes the working speed be high. When this input/output circuit is used in the PLD, the programmable logic elements can be used only for arranging the inherent logical function, so that the efficiency of use of PLD can be enhanced.

Further, when at least one dynamic selector circuit is provided, whereby an output signal from another input/output circuit can be input into the storage element, and an output signal from the storage element can be supplied to another input/output circuit, it becomes possible to connect this input/output circuit to other input/output circuits, so that the expansion can be made easy.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENTS

The embodiments of the present invention will hereunder be described in detail with reference to the accompanying drawings.

Figure 1:
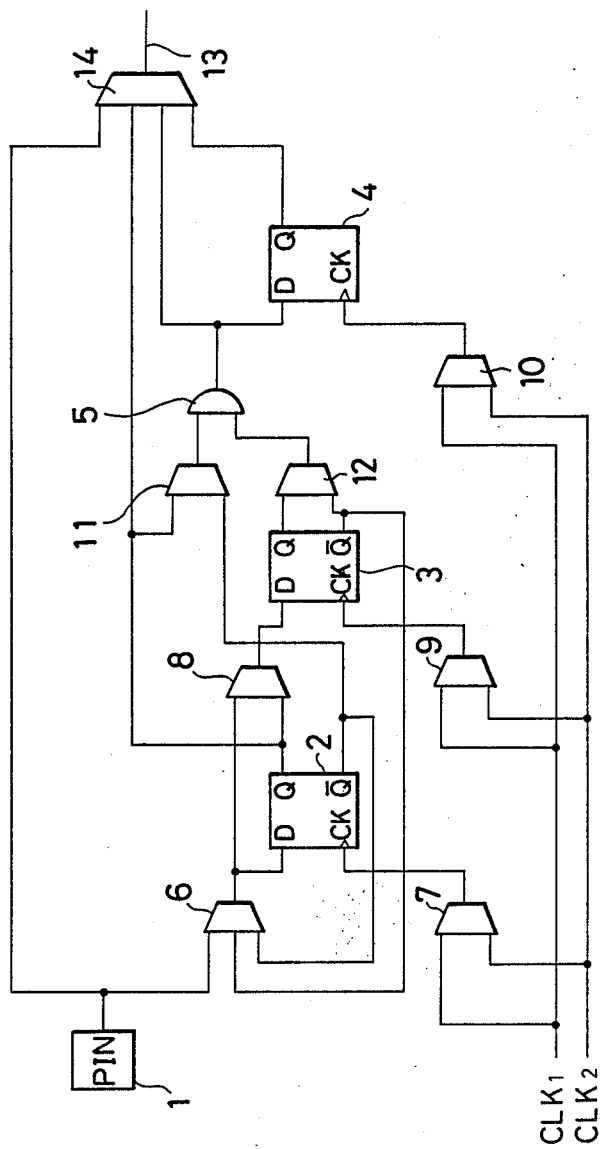
FIG. 1 is a circuit diagram showing a first embodiment of the present invention.

FIG. 1 is the circuit diagram showing the first embodiment of the present invention.

This first embodiment includes: a input terminal 1; three D type flip-flops 2, 3 and 4 as being storage elements; a combinational logic circuit 5; selectors 6, 7, 8, 9 and 10 for programmably selecting inputs into the flip-flops 2, 3 and 4; selectors 11 and 12 for programmably selecting an input into the combinational logic circuit 5; a selector 14 for programmably selecting an output to an output terminal 13; and the like.

The signal input into a D input terminal of the flip-flop 2 is selected by the selector 6. Connected to three input terminals of the selector 6 are a signal from the input terminal 1, an inverted output Q of the flip-flop 2 itself and an inverted output Q of another flip-flop 3, whereby one of these signals can be desirably selected.

A signal input into a clock input terminal CK of the flip-flop 2 is selected by the selector 7. Input into the selector 7 are two clocks, a high speed clock CLK 1, and, a low speed clock CLK2 and the like for example, whereby either one of these signals can be desirably selected. Other examples of these two clocks are those having the mutual relationship, in which the frequency is the same, but is shifted in phase (including the relationship of being inverted from each other), and the like.

The signal input into a D input terminal of the flip-flop 3 is selected by the selector 8. Connected to two input terminals of the selector 8 are an output Q from the flip-flop 2 and the selected output by the selector 6, whereby either one of these signals can be desirably selected. Connected to a clock input terminal CK of the flip-flop 3 is a selected output by the selector 9, whereby either one of the aforesaid two clocks CLK1 and CLK2 is desirably selected and input.

In this embodiment, the combinational logic circuit 5 is formed into a logical AND circuit, however, it may be formed into a logical OR circuit, a logical NOR circuit or the like. Two signals input into the combinational logic circuit 5 are selected by the selector 11 and the selector 12, respectively. Connected to two input terminals of the selector 11 are an output Q from the flip-flop 2 and the inverted output Q from the same flip-flop 2, whereby either one of these signals can be desirably selected. Connected to two input terminals of the selector 12 are an output Q from the flip-flop 3 and an inverted output Q from the same flip-flop 3, whereby either one of these signals can be desirably selected.

Connected to a D input terminal of the flip-flop 4 is an output from the combinational logic circuit 5. Connected to the clock input terminal CK of the flip-flop 4 is a selected output by the selector 10, whereby either one of the two clocks CLK1 and CLK2 can be desirably selected and input.

A signal output to the output terminal 13 is selected by the selector 14. Connected to four input terminals of the selector 14 are the signal from the input terminal 1, the output Q from the flip-flop 2, the output from the combinational logic circuit 5 and the output Q from the flip-flop 4, whereby one of these signals can be desirably selected.

Figure 2:
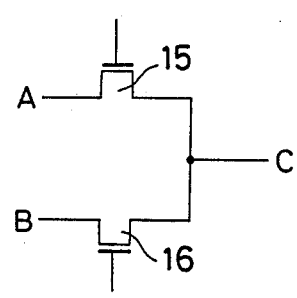
FIG. 2 is a circuit diagram showing one example of the programmable selector used in the first embodiment.

FIG. 2 is a circuit diagram showing one example of the programmable selector.

This selector is a two input selector consisting of two N channel type MOS transistors 15 and 16. Connected to the input side of the one transistor 15 is a signal A, while, connected to the input side of the other transistor 16 is a signal B, and output sides of the two transistors are commonly connected. Either one of the two transistors is brought into the conductive condition by programming, whereby either one of the input signals A and B is selected as an output C.

Figure 3:
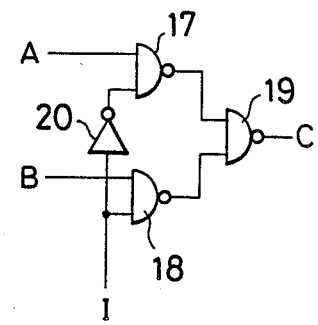
FIG. 3 is a circuit diagram showing another example of the programmable selector used in the first embodiment.

FIG. 3 is the circuit diagram showing another example of the programmable selector.

This selector is a two input selector consisting of three logical NAND gates 17, 18 and 19 and an inverter 20. In the NAND gate 17, when a signal obtained by inverting a gate input I by the inverter 20 is at the high level, the gate 17 is opened, whereby one input A is passed therethrough. In the NAND gate 18, when the gate input I is at the high level, the gate 18 is opened, whereby the other input B is passed therethrough. The NAND gate 19 functions as a logical OR circuit of negative logic inputs which are input from the NAND gate 17 or 18, and either one of the inputs is turned into an output C of positive logic. The aforesaid gate input I can be desirably set by the programming and, when the gate input I is set at the high level, the NAND gate 17 is closed and the NAND gate 18 is opened, whereby the input B is selected. On the contrary, when the gate input I is set at the low level, the NAND gate 17 is opened and the NAND gate 18 is closed, whereby the input A is selected.

In the embodiments of the selector as shown in FIGS. 2 and 3, the two input selectors have been described, however, if the numbers of the gate elements or gate circuits are increased commensurate with the number of the inputs, then multiple input selectors such as a three input selector and a four input selector can be formed similarly. Furthermore, it is possible that a gate element is formed of complementary transfer gates including an N channel type MOS transistor and a P channel type MOS transistor.

An example of application of an input/output circuit formed by use of the first embodiment will hereunder be shown.

Figure 4A:
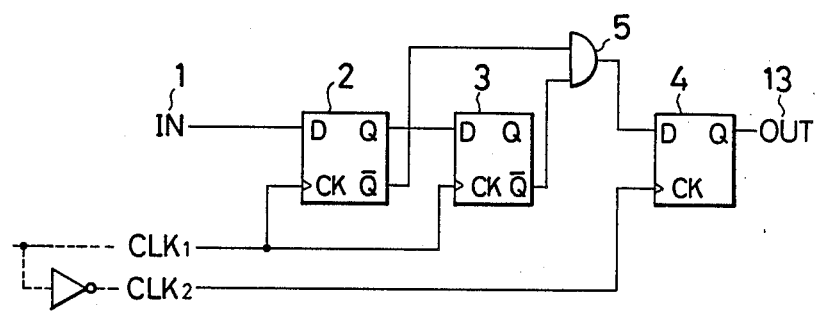
FIGS. 4A and 4B are a circuit diagram and a working timing chart of a low level sensing circuit, which is an example of application of the first embodiment.
Figure 4B:
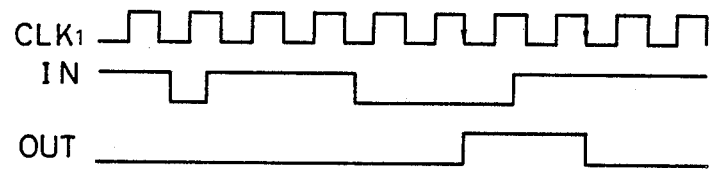

FIGS. 4A and 4B are the input signal low level sensing circuit diagram 4A and the working timing chart 4B thereof. In the circuit diagram 4A, the selector itself is not shown, but the result selected by the selector is shown.

Input into the clock input terminal CK of the flip-flop 4 is the clock CLK2 obtained by inverting the clock CLK1 which is input into the clock input terminals CK of the flip-flops 2 and 3. A signal IN input to the input terminal 1 is input into the D input terminal of the flip-flop 2 and the output Q thereof is input into a D input terminal of the flip-flop 3 at the next stage. The inverted outputs Q of the flip-flop 2 and 3 are input together into the combinational logic circuit 5 and a logical AND thereof is input into a D input terminal of the flip-flop 4. An output OUT from the output terminal 13 is obtained by selecting an output from the flip-flop 4.

As shown in FIG. 4B, in this input/output circuit, only when the input signal IN continues to be held at the low level for 1.5 clocks or more, the low level is sensed by the output OUT through the shift functions of the flip-flops 2, 3 and 4. When the input signal IN continues to be held at the low level for less than 1.5 clocks, the output OUT does not sense the low level, and the input signal IN then is regarded as noise and can be removed.

Figure 5A:
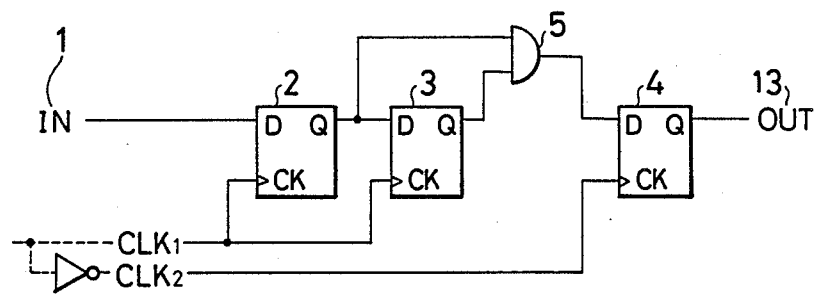
FIGS. 5A and 5B are a circuit diagram and a working timing chart of a high level sensing circuit, which is another example of application of the first embodiment.
Figure 5B:
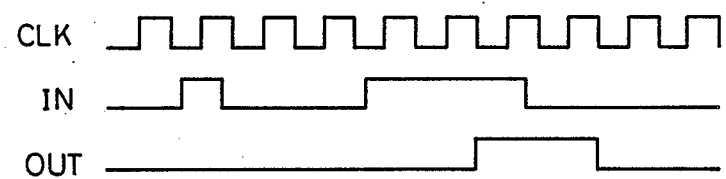

FIGS. 5A and 5B are the input signal high level sensing circuit diagram 5A and the timing chart 5B showing the working thereof.

The circuit arrangement thereof is similar to the one shown in FIG. 4A except that the inputs into the combinational logic circuit 5 are the outputs Q from the flip-flops 2 and 3.

As shown in FIG. 5B, in this input/output circuit, only when the input signal IN continues to be held at the high level for 1.5 clocks or more, the high level is sensed by the output OUT through the functions of the flip-flops 2, 3 and 4. When the input signal IN continues to be held at the high level for less than 1.5 clocks, the high level is not sensed by the output OUT, and the input signal IN then is regarded as noise and can be removed.

Figure 6A:
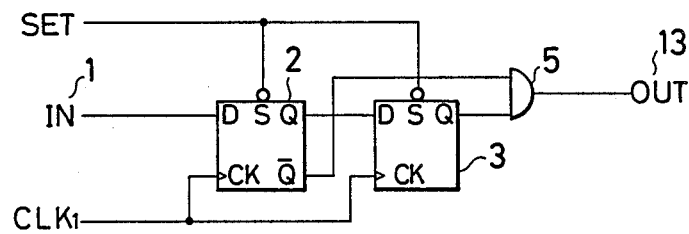
FIGS. 6A and 6B are a circuit diagram and a working timing chart of a falling edge detecting circuit, which is a further example of application of the first embodiment.
Figure 6B:
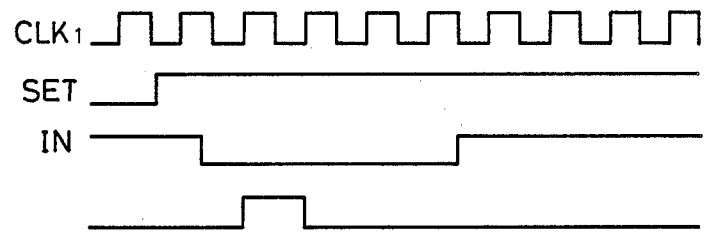

FIGS. 6A and 6B are the input signal falling edge detecting circuit diagram 6A and the timing chart 6B showing the working thereof.

In this circuit also, the flip-flops 2 and 3 are connected to each other to form a shift circuit. Both of the inverted output Q of the flip-flop 2 and the output Q of the flip-flop 3 are selected and input into the two input terminals of the combinational logic circuit 5 and a logical AND thereof is output to the output terminal 13. As for set inputs S for the flip-flops 2 and 3, if such an arrangement is adopted that the set input terminals S of the two flip-flops are connected to each other and a SET input can be applied to the flip-flops from the outside, then it is preferable that the SET input may be utilized for locking of the output OUT at the initial time such as the power-on and for an enable input during the working.

As shown in FIG. 6B, in this input/output circuit, when the SET input is at the high level, the output OUT can be delivered for one clock from the time the low level of the input signal IN is shifted by the flip-flop 2 at the former stage to the time the signal is shifted by the flip-flop 3 at the latter stage, through the shift functions of the flip-flops 2 and 3.

Figure 7A:
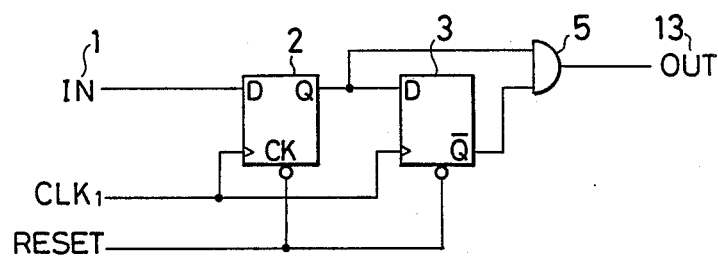
FIGS. 7A and 7B are a circuit diagram and a working timing chart of a rising edge detecting circuit, which is a still further example of application of the first embodiment.
Figure 7B:
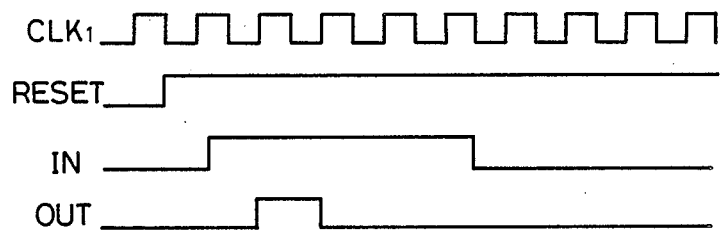

FIGS. 7A and 7B are the input signal rising edge detecting circuit diagram 7A and the timing chart 7B showing the working thereof.

The circuit arrangement thereof is identical with the one shown in FIG. 6A except that two signals input into the combinational logic circuit 5 are the output Q from the flip-flop 2 and the inverted output Q from the flip-flop 3. Reset terminals of the flip-flops 2 and 3 are connected to each other so that RESET input can be input from the outside. If the RESET input terminal is provided as described above, then it is preferable that the RESET input may be utilized for locking of the output OUT at the initial time such as the power-on and for an enable input during the working.

As shown in FIG. 7B, in this input/output circuit, when the RESET input is at the high level, the output OUT can be delivered for one clock from the time the high level of the input signal IN is shifted by the flip-flop 2 at the former stage to the time the signal is shifted by the flip-flop 3 at the latter stage, through the shift functions of the flip-flops 2 and 3.

Figure 8A:
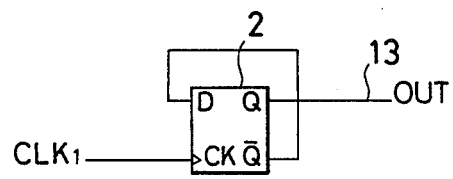
FIGS. 8A and 8B are a circuit diagram and a working timing chart of a ½ frequency dividing circuit, which is a still further example of application of the first embodiment.
Figure 8B:
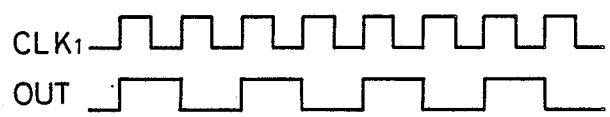

FIGS. 8A and 8B are the circuit diagram 8A of a ½ frequency dividing circuit of the clock CLK1 and the timing chart 8B showing the working thereof.

This dividing circuit is of such an arrangement that, in the flip-flop 2, its inverted output Q is returned to the D input terminal thereof and the output Q is output to the output terminal 13. By doing so, the clock CLK1 can be divided into ½ as shown in FIG. 8B.

Figure 9A:
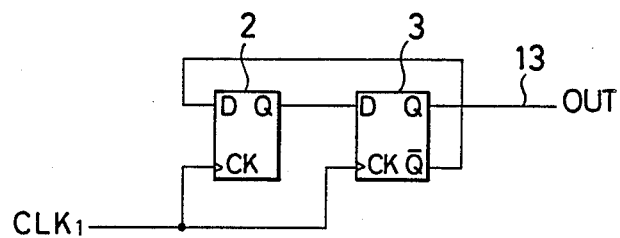
FIGS. 9A and 9B are a circuit diagram and a working timing chart of a ¼ frequency dividing circuit, which is a yet further example of application of the first embodiment.
Figure 9B:
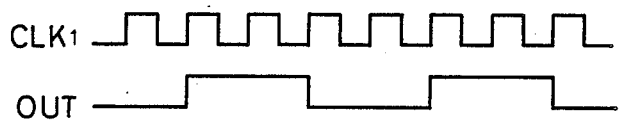

FIGS. 9A and 9B are the circuit diagram 9A of a ¼ frequency dividing circuit of the clock CLK1 and the timing chart 9B showing the working thereof.

This dividing circuit is of such an arrangement that, one and the same clock CLK1 is input into the clock input terminals CK of the both flip-flops 2 and 3, the inverted output Q of the flip-flop 3 is input to the D input terminal of the flip-flop 2, and the output Q from the flip-flop 2 is input into the D input terminal of the flip-flop 3. The output Q from the flip-flop 3 is output to the output terminal 13. By doing so, the clock CLK1 can be divided into ¼ as shown in FIG. 9B.

As described above, in the first embodiment, by use of the programmable selector, the input circuit or the output circuit for directly processing the input signal or output signal can be desirably designed. In consequence, the input signal from the input terminal or the output signal into the output terminal can be processed by the shortest wiring, so that the working speed can be raised. Although it is the "programmable", the arrangement is suitable for the input/output circuit and the degree of waste is low. Therefore, this embodiment can be formed to be smaller in terms of the occupying area than the case where the input/output circuit is formed by use of the programmable logic elements, so that the working speed can be raised to a high speed and the efficiency of use of the elements can be improved.

Figure 10:
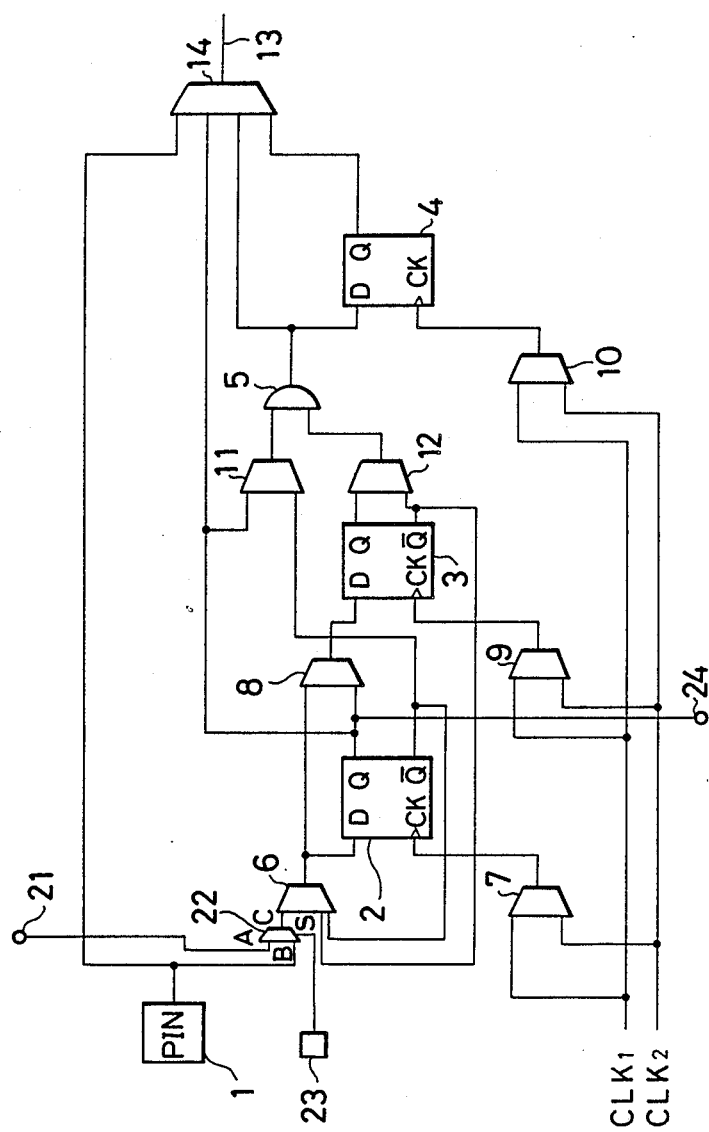
FIG. 10 is a circuit diagram showing a second embodiment of the present invention.

FIG. 10 is the second embodiment of the circuit diagram according to the present invention wherein expansion is made easy.

Similarly to the first embodiment, according to this second embodiment, in the programmable input/output circuit including the one input terminal 1, the three D type flip-flops 2, 3 and 4, the one combinational logic circuit 5, the eight selectors 6, 7, 8, 9, 10, 11, 12 and 14 and the output terminal 13, there are further added an input terminal 21 from an adjoining input/output circuit (Input Output Block: IOB), a dynamic selector circuit 22 for supplying a signal (c) selected from signals including a signal (A) input from the input terminal 21 and a signal (B) input from the input terminal 1 to the selector 6 for selecting an input D of the flip-flop 2, a parallel-serial switching terminal 23 for inputting a signal (S) to switch the dynamic selector circuit 22 and an output terminal 24 for outputting an output signal from the flip-flop 2 into the other adjoining IOB.

A signal input into one of three input terminals of the selector 6 is pre-selected by the dynamic selector circuit 22. Connected to the two input terminals A and B of the dynamic selector circuit 22 are an output signal from the adjoining IOB and an input signal input from the input terminal 1, whereby selector can be desirably made from whether this input/output circuit is used in parallel states independent of each other or used in serial states connected to each other, in accordance with the conditions of the switching signal S input from the parallel-serial terminal 23.

Figure 11:
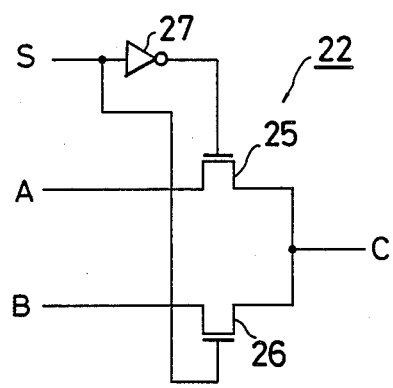
FIG. 11 is a circuit diagram showing an example of the dynamic selector circuit used in the second embodiment.
Figure 12:
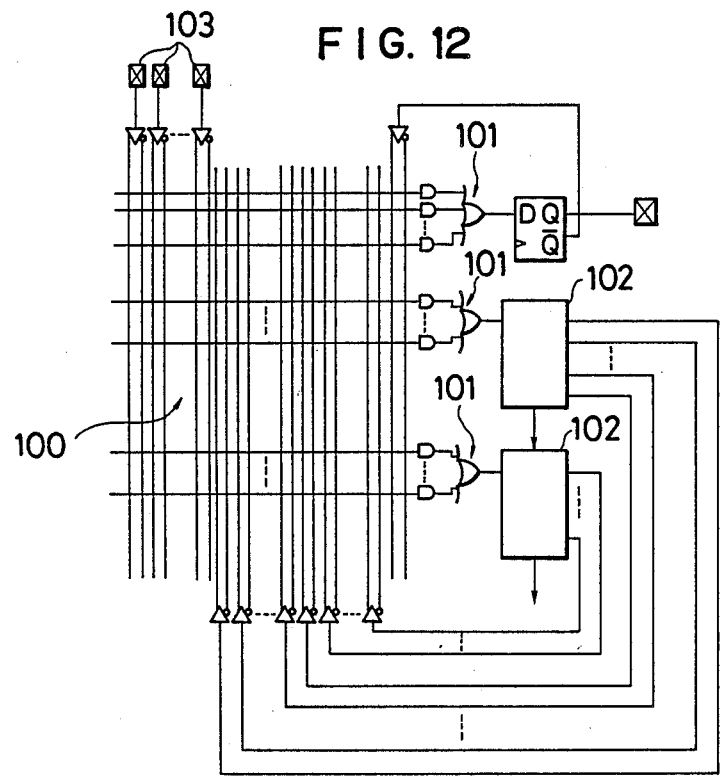
FIG. 12 is a circuit diagram showing a conventional example of the programmable logic element.

FIG. 11 is the circuit diagram showing an example of the dynamic selector circuit 22.

This dynamic selector circuit 22 is a two input selector consisting of two N channel type MOS transistors 25, 26 and an inverter 27. Connected to the input side of the one transistor 25 is the signal A, while, connected to the input side of the other transistor 26 is the signal B, whereby the output sides C of the transistors are commonly connected. By either the switching signal S or a signal obtained by inverting the switching signal S by the inverter 27, either one of the transistors 25 and 26 is brought into the conductive condition and the other is brought into the non-conductive condition, whereby either one of the inputs A and B is turned into the output C.

In this embodiment, as the input signal into the flip-flop 2 at the first stage, the output from the adjoining IOB can also be input, so that the expansion by the serial connection of the input/output circuit can be made easy. Incidentally, the storage element, into which the output from the adjoining IOB is inputtable, is not limited to this, and the flip-flops 3 and 4 at the stages from the second stage and so forth or at the last stage may be adopted. In addition, two or more different signals can be made inputtable into two or more storage elements.

Furthermore, in this embodiment, the output from the adjoining IOB cannot be directly input into the storage element and can be input through the programmable selector 6, so that the scope of selecting the input signals input into the storage element is large. Incidentally, the output from the adjoining IOB can be directly input into the storage element, not through the selector 6.

Further, in this embodiment, the output to the other adjoining IOB is outputtable from the flip-flop 2 itself, into which the output from the adjoining IOB can be input, so that the expansion can be easily made. Incidentally, the storage element to output the signal to the other adjoining IOB is not limited to this, and the flip-flops 3 and 4 at the stages from the second stage and so forth or at the last stage may be adopted. Furthermore, two or more storage elements can be made outputtable such signals.

Incidentally, the present invention is not limited to the circuits in the above embodiments, and a circuit with such an arrangement can be desirably adopted that the circuit is provided therein with one or more output terminals, one or more storage elements such as flip-flops, one or more programmable selectors and one or more combinational logic circuits, whereby, for example, a signal output to the output terminal can be selected by the selector from signals including a signal from the input terminal, a signal from an output terminal of the D type flip-flop and a signal from an output terminal of the combinational logic circuit. Further, a signal input into the D input terminal of the D type flip-flop can be selected by the selector from signals including a signal from the output terminal of itself, a signal from the input terminal, a signal from the combinational logic circuit and a signal from the output terminal of another D type flip-flop. Furthermore, such an arrangement may be adopted that a signal input into the combinational logic circuit can be selected by the selector from signals including a signal from the output terminal of another combinational logic circuit, a signal from the input terminal and a signal from the output terminal of the D type flip-flop.

Furthermore, a clock input into the D type flip-flop may be desirably selected from a signal from the output terminal of itself in addition to a clock input from the outside.

As has been described hereinabove, the present invention can be put to various applications within the scope of the technical gist thereof so as to take various specific forms.

What is claimed is:

1. A programmable input/output circuit connected to an input terminal or an output terminal of an integrated circuit, comprising:
   input terminal means for connecting the input terminal of an integrated circuit to the programmable input/output circuit or for connecting the integrated circuit to the programmable input/output circuit;
   at least one storage element;
   at least one combinational logic circuit;
   output terminal means for connecting the programmable input/output circuit to the integrated circuit or for connecting the programmable input/output circuit to the output terminal of the integrated circuit; and
   at least one programmable selector;
   wherein: two or more signal lines from a plurality of signal lines including at least a signal line from said input terminal means, an output signal line from said storage element and an output signal line from said combinational logic circuit are connected to input terminals of said selector; and an output selected by said selector is directly connected to any one of output or input terminals including at least an input terminal of said storage element, an input terminal of said combinational logic circuit and said output terminal means.

2. The programmable input/output circuit as set forth in claim 1, further comprising a storage element input selector means wherein said storage element input selector means selects one signal line from said plurality of signal lines including a signal line of said input terminal and an output signal line of said storage element and wherein the output of said storage element input selector means is connected to an input signal line of said storage element.

3. The programmable input/output circuit as set forth in claim 1, further comprising a clock selector means wherein said clock selector means selects one clock signal line from a plurality of clock signal lines and wherein the output of said clock selector means is connected to an input signal line of said storage element.

4. The programmable input/output circuit as set forth in claim 1, further comprising first and second selector means wherein said first selector means selects one signal line from said plurality of signal lines including an output signal line from said storage element and an output signal from said second selector means.

5. The programmable input/output circuit as set forth in claims 1, further comprising a storage element output selector means wherein said storage element output selector means selects one signal line from a plurality of output signal lines from said storage element and wherein the output of said storage element selector means is connected to an input signal line of said combinational logic circuit.

6. The programmable input/output circuit as set forth in claim 1, further comprising a circuit output selector means wherein said circuit output selector means selects one signal line from said plurality of signal lines including a signal line of said input terminal means, an output signal line of said storage element and an output signal line of said combinational logic circuit and wherein an output signal line of said circuit output selector means is connected to the terminal output means.

7. A programmable input/output circuit connected to an input terminal or an output terminal of an integrated circuit, including:
input terminal means for connecting the input terminal of the integrated circuit to the programmable input/output circuit or for connecting the integrated circuit to the programmable input/output circuit;
at least one storage element;
output terminal means for connecting the programmable input/output circuit to the integrated circuit or for connecting the programmable input/output circuit to the output terminal of the integrated circuit;
at least one programmable selector; and
at least one dynamic selector circuit;
wherein: said dynamic selector circuit connects a signal line selected from a plurality of signal lines including at least an output signal line from a first another input/output circuit and a signal line from said input terminal means to an input terminal of said storage element; and an output signal line from said storage element can be connected to a second another input/output circuit.

8. The programmable input/output circuit as set forth in claim 7, wherein said dynamic selector circuit connects a selected signal line to the input signal line of a storage element.

9. The programmable input/output circuit as set forth in claim 7, wherein said dynamic selector circuit connects a selected signal line to the input signal line of said selector.

10. A programmable input/output circuit connected to an input terminal or an output terminal of an integrated circuit, comprising:
input terminal means having a signal line for connecting the input terminal of an integrated circuit to the programmable input/output circuit or for connecting the integrated circuit to the programmable input/output circuit;
at least one storage element;
at least one combinational logic circuit;
output terminal means having a signal line for connecting the programmable input/output circuit to the integrated circuit or for connecting the programmable input/output circuit to the output terminal of the integrated circuit; and
at least one programmable selector;
wherein: two or more signal lines from a plurality of signal lines including at least a signal line from said input terminal means, an output signal line from said storage element and an output signal line from said combinational logic circuit are connected to input terminals of said selector; and an output selected by said selector is connected to any one of output or input terminals including at least an input terminal of said storage element, an input terminal of said combinational logic circuit and said output terminal means.

11. The programmable input/output circuit as set forth in claim 10, further comprising a storage element input selector means wherein said storage element input selector means selects one signal line from said plurality of signal lines including a signal line of said input terminal and an output signal line of said storage element and wherein the output of said storage element input selector means is connected to an input signal line of said storage element.

12. The programmable input/output circuit as set forth in claim 10, further comprising a clock selector means wherein said clock selector means selects one clock signal line from a plurality of clock signal lines and wherein the output of said clock selector means is connected to an input signal line of said storage element.

13. The programmable input/output circuit as set forth in claim 10, further comprising first and second selector means wherein said first selector means selects one signal line from said plurality of signal lines including an output signal line from said storage element and an output signal from said second selector means.

14. The programmable input/output circuit as set forth in claims 10, further comprising a storage element output selector means wherein said said storage element output selector means selects one signal line from a plurality of output signal lines from said storage element and wherein the output of said storage element selector means is connected to an input signal line of said combinational logic circuit.

15. The programmable input/output circuit as set forth in claim 10, further comprising a circuit output selector means wherein said circuit output selector means selects one signal line from said plurality of signal lines including a signal line of said input terminal means, an output signal line of said storage element and an output signal line of said combinational logic circuit and wherein an output signal line of said circuit output selector means is connected to the terminal output means.

* * * * *